United States Patent
Honma

(10) Patent No.: US 6,464,948 B2
(45) Date of Patent: Oct. 15, 2002

(54) OZONE PROCESSING APPARATUS FOR SEMICONDUCTOR PROCESSING SYSTEM

(75) Inventor: Kenji Honma, Sagamihara (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 09/769,401

(22) Filed: Jan. 26, 2001

(65) Prior Publication Data

US 2001/0007645 A1 Jul. 12, 2001

Related U.S. Application Data

(63) Continuation of application No. PCT/JP00/02695, filed on Apr. 25, 2000.

(30) Foreign Application Priority Data

May 28, 1999 (JP) .......................................... 11-149861

(51) Int. Cl.$^7$ ................................................ B01J 19/08
(52) U.S. Cl. ........................ 422/186.12; 422/186.08; 422/186.09; 422/186.29; 422/186.3
(58) Field of Search ..................... 422/186.07, 186.08, 422/186.09, 186.16, 186.29, 186.3

(56) References Cited

U.S. PATENT DOCUMENTS 5,904,170 A * 5/1999 Harvey et al. ......... 422/186.14

FOREIGN PATENT DOCUMENTS

| JP | 3-255615 | 11/1991 |
| JP | 6-163480 | 6/1994 |
| JP | 8-117068 | 5/1996 |

* cited by examiner

Primary Examiner—Kishor Mayekar
(74) Attorney, Agent, or Firm—Oblon, Spivak, McClelland, Maier & Neustadt, P.C.

(57) ABSTRACT

An ozone processing apparatus for a semiconductor processing system includes an ozone generating unit and a reforming processing unit connected to each other through a connection piping section. The ozone generating unit includes an ozone generator and a pressure regulator connected to each other through a piping line. The connection piping section has a double-pipe structure consisting of an inner pipe and an outer pipe. The piping line and the inner pipe are made of a fluorocarbon resin. A branch line branches from the middle of the piping line, and is connected to a factory exhaust passageway. The branch line is provided with a flowmeter and an ozone densitometer. A controller is arranged to control the ozone generator with reference to the value of ozone concentration measured by the densitometer.

13 Claims, 4 Drawing Sheets

OZONE PROCESSING APPARATUS FOR SEMICONDUCTOR PROCESSING SYSTEM

CROSS-REFERENCE TO RELATED APPLICATIONS

This is a Continuation Application of PCT Application No. PCT/JP00/02695, filed Apr. 25, 2000, which was not published under PCT Article 21(2) in English.

This application is based upon and claims the benefit of priority from the prior Japanese Patent Application No. 11-149861, filed May 28, 1999, the entire contents of which are incorporated herein by reference.

BACKGROUND OF THE INVENTION

The present invention relates to an ozone processing apparatus for a semiconductor processing system, which is used for subjecting a target substrate, such as a semiconductor wafer, to a process, such as reformation or oxidization, using ozone. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or an LCD substrate, by forming semiconductor layers, insulating layers, and conductive layers in predetermined patterns on the target substrate.

In the processes of manufacturing semiconductor devices, activated oxygen atoms, i.e., oxygen radicals, are used, for example, when a thin film of, e.g., tantalum oxide (TaOx), disposed on a target substrate, such as a semiconductor wafer, is subjected to reformation. In this case, ozone ($O_3$) is generated in an ozone generating unit and is activated by, e.g., an ultraviolet (UV) lamp, so that oxygen radicals to be used are generated.

FIG. 5 is a schematic view showing a conventional ozone processing apparatus for performing a reforming process. As shown in FIG. 5, the apparatus includes an ozone generating unit 10 and a reforming processing unit 20 connected to each other through a stainless steel piping line 15. The ozone generating unit 10 has a casing 14, in which an ozone generator 11, an ozone densitometer 12, and a pressure regulator 13 are disposed. On the other hand, the processing unit 20 has a process chamber 21, in which a worktable 23 is disposed for supporting a wafer W thereon. Above the process chamber 21, an UV lamp 22 is disposed, for radiating ultraviolet rays into the process chamber 21. A vacuum pump 24 is connected to the bottom of the process chamber 21 through a piping line.

In this apparatus, first, a raw material gas formed by mixing oxygen gas and nitrogen gas with each other is supplied to the ozone generator 11, where Radio Frequency (RF) high power is applied to the raw material gas to generate ozone gas. Then, the ozone gas, i.e., the process gas, is sent to the process chamber 21 through the piping line 15. In the process chamber 21, the ozone gas is activated by ultraviolet rays from the UV lamp 22 to generate oxygen atoms, i.e., oxygen radicals, with which the wafer W on the worktable 23 is processed. During this process, the interior of the process chamber 21 is exhausted by the vacuum pump 24.

In the ozone processing apparatus shown in FIG. 5, however, there is a problem in that the wafer W and/or a thin film thereon are contaminated by compounds of metals, such as chromium and iron, which seem to be derived from constituent materials of the piping line 15, the process chamber 21, and so forth. Such metal compounds, even in small amounts, can be serious causes of degrading the quality of semiconductor devices, as the semiconductor devices are smaller and thinner.

BRIEF SUMMARY OF THE INVENTION

An object of the present invention is to provide an ozone processing apparatus, which can suppress the occurrence of metal contamination in a target substrate.

According to a first aspect of the present invention, there is provided an ozone processing apparatus for a semiconductor processing system, comprising:

an airtight process chamber;

a support member disposed in the process chamber and configured to support a target substrate;

an exhaust system configured to exhaust the process chamber;

a process gas supply line connected to the process chamber;

an ozone generator connected to the process gas supply line and configured to supply an ozone-containing gas through the process gas supply line into the process chamber;

a raw material gas supply line connected to the ozone generator;

an oxygen source connected to the raw material gas supply line and configured to supply oxygen gas through the raw material gas supply line into the ozone generator;

a branch line extending from the process gas supply line and arranged not to be connected to the process chamber;

a densitometer disposed on the branch line and configured to measure ozone concentration of the ozone-containing gas; and a controller configured to control the ozone generator with reference to a measured value of the ozone concentration measured by the densitometer.

According to a second aspect of the present invention, there is provided an ozone processing apparatus for a semiconductor processing system, comprising:

an airtight process chamber;

a support member disposed in the process chamber and configured to support a target substrate;

an exhaust system configured to exhaust the process chamber;

a process gas supply line connected to the process chamber and made of a non-metallic material;

an ozone generator connected to the process gas supply line and configured to supply an ozone-containing gas through the process gas supply line into the process chamber;

a raw material gas supply line connected to the ozone generator;

an oxygen source connected to the raw material gas supply line and configured to supply oxygen gas through the raw material gas supply line into the ozone generator;

an envelope airtightly surrounding the process gas supply line such that a gap space is formed between the process gas supply line and the envelope;

a drying system configured to supply a heated dry gas into the process gas supply line, thereby drying the process gas supply line from an inner surface; and a ventilation system configured to ventilate the gas space.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 5:
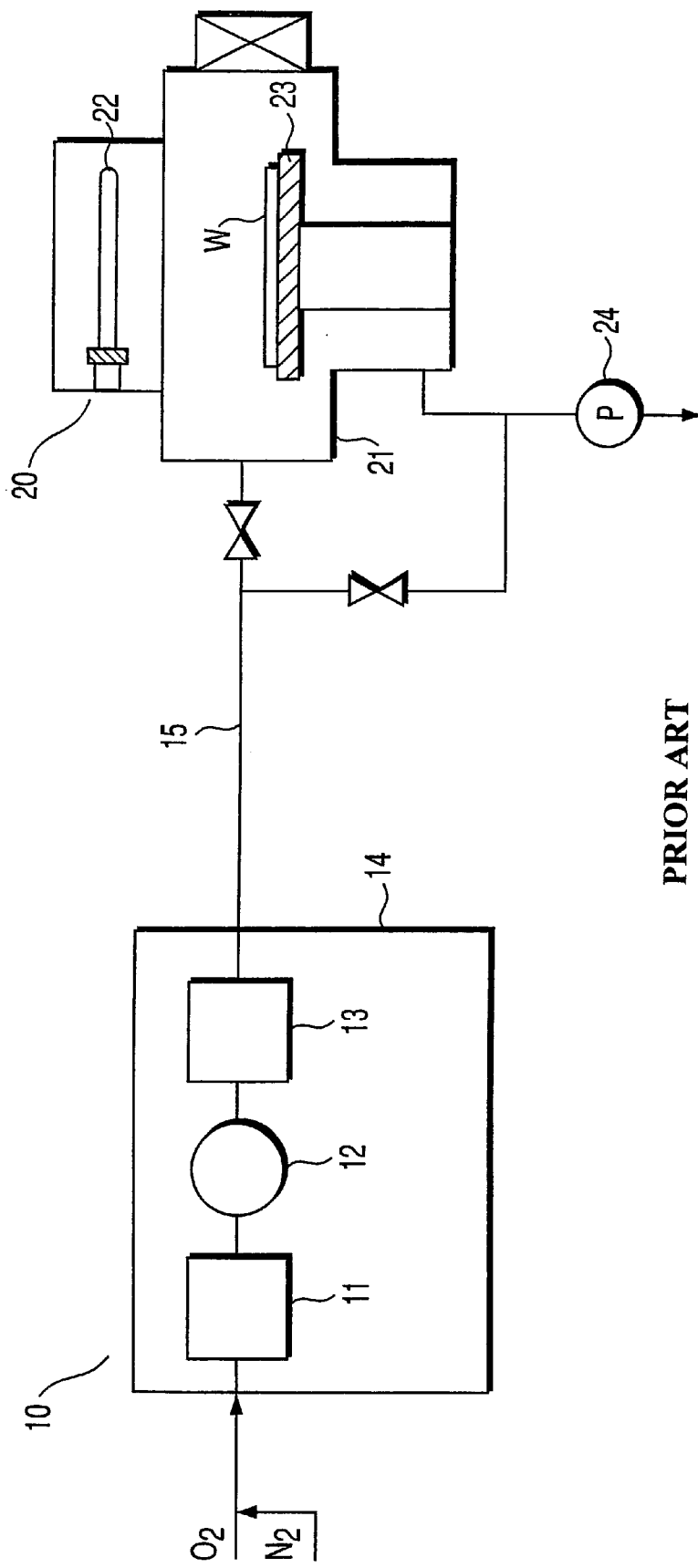
FIG. 5 is a schematic view showing a conventional ozone processing apparatus for performing a reforming process.

In the process of developing the present invention, the present inventors conducted a research on causes as to why metal contamination occurred in the wafer W in conventional ozone processing apparatuses as described with reference to FIG. 5. As a result, the present inventors have obtained the following findings.

In order to prevent oxygen atoms (O), which are generated when oxygen is changed into ozone, from being changed back into $O_2$, nitrogen ($N_2$) gas is mixed in the raw material gas at about 0.5%. Part of the nitrogen gas reacts with oxygen atoms to produce nitrogen oxide ($NO_x$), which is then sent to the process chamber 21 of the processing unit 20 (see FIG. 5). In this case, if moisture sticks to the inside of the piping line 14 because, e.g., the piping line 14 was disassembled for a maintenance operation, the $No_x$ reacts with the moisture to produce nitric acid. The nitric acid reacts with the stainless steel constituting the piping line 14 to produce compounds of metals, such as chromium (Cr) and iron (Fe). These metal compounds are scattered into the ozone gas and sent into the process chamber 21, thereby bringing about metal contamination in the wafer W during the process.

As disclosed in Jpn. Pat. Appln. KOKAI Publication No. 6-163480, PTFE (polytetrafluoroethylene resin: Teflon (trade name)) is known as a material for piping lines, which is not corroded by nitric acid. However, where the piping lines of the apparatus shown in FIG. 5 are made of PTFE, since PTFE is porous, it is necessary to spend a long time to dry out the PTFE interior of the piping lines after it absorbs moisture due to, e.g., a maintenance operation. If the moisture absorbed by the PTFE interior is unsatisfactory dried, the moisture is mixed into the flowing gas. Consequently, nitric acid can be easily produced in the piping lines, and thus, if the process chamber 21 is made of stainless steel, compounds of metals, such as chromium and iron, are produced.

As disclosed in Jpn. Pat. Appln. KOKAI Publication No. 8-117068, aluminum and nickel are also known as other materials for piping lines. However, where the piping lines of the apparatus shown in FIG. 5 are made of either of the materials, it is difficult to prevent corrosion by nitric acid, thereby bringing about metal contamination in the wafer W. Furthermore, if the process chamber 21 is made of stainless steel, compounds of metals, such as chromium and iron, are produced, due to the reaction with nitric acid.

In this respect, there is a problem in that $O_2$ gas cannot avoid containing a small amount of moisture due to a process of manufacture, while the moisture concentration in high purity $N_2$ gas falls in a negligible range. The moisture reacts with $NO_x$ to produce nitric acid. The gas flow passageway of the ozone densitometer 12 is made of a metal, such as stainless steel, the nitric acid thus produced corrodes the metal and brings about metal contamination in the wafer W.

Some embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

Figure 1:
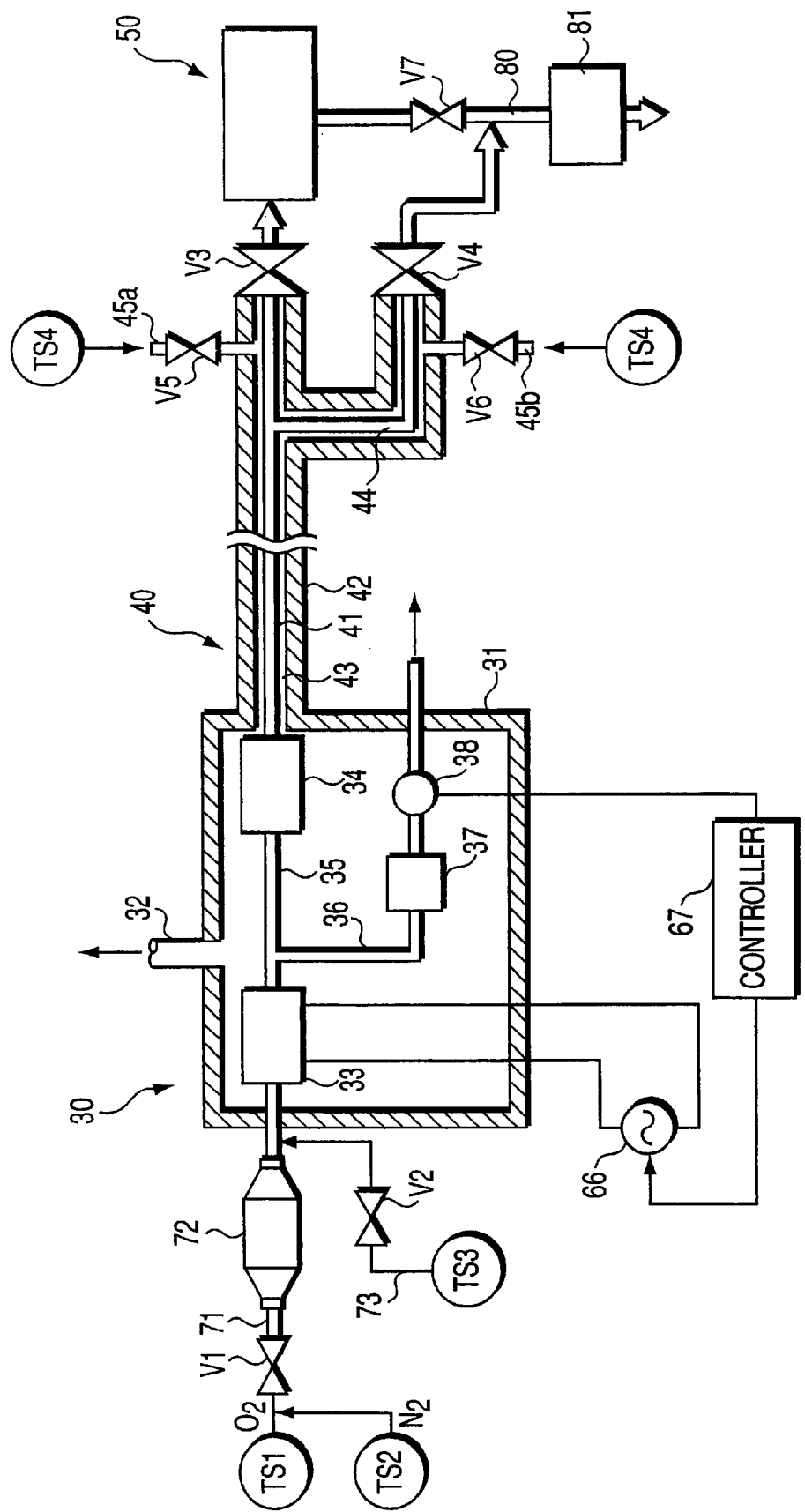
FIG. 1 is a sectional view showing an ozone processing apparatus for performing a reforming process in a semiconductor processing system, according to an embodiment of the present invention.

FIG. 1 is a sectional view showing an ozone processing apparatus for performing a reforming process in a semiconductor processing system, according to an embodiment of the present invention. As shown in FIG. 1, the apparatus includes an ozone generating unit 30 and a reforming processing unit 50 connected to each other through a connection piping section 40.

The ozone generating unit 30 has a structure to airtightly surround the internal devices by a casing 31. The ceiling of the casing 31 is connected to an exhaust line 32 communicating with a factory exhaust passageway (not shown). An ozone generator 33 and a pressure regulator 34 are disposed in the casing 31, and connected to each other through a piping line 35. The piping line 35 and the pressure regulator 34 are made of a non-metallic material having a certain corrosion-resistance against $NO_x$, such as a fluorocarbon resin, e.g., PTFE or PFA (perfluoroalkoxy resin).

A branch line 36 branches from the middle of the piping line 35, and is connected to a factory exhaust passageway. The branch line 36 is provided with a flowmeter 37 and an ozone densitometer 38. The interior of the flowmeter 37 is made of a non-metallic material having a certain corrosion-resistance against to $NO_x$, such as a fluorocarbon resin, e.g., PTFE or PFA. On the other hand, inside the ozone densitometer 38, a portion made of a metal, such as stainless steel, is exposed. However, since the ozone densitometer 38 is disposed out of the main line 35, a metal compound, which may be produced from the ozone densitometer 38, is prevented from being sent to the processing unit 50.

Furthermore, the flowmeter 37 generates a pressure difference in the branch line 36 to function as a member for preventing a backward flow. This function works for preventing metal compounds from flowing backward from the ozone densitometer 38 to the main line 35. Note that, if another member for preventing a backward flow, such as a check valve, is disposed on the upstream side of the ozone densitometer 38, the flow mater may be disposed on the downstream side of the ozone densitometer 38.

Figure 2A:
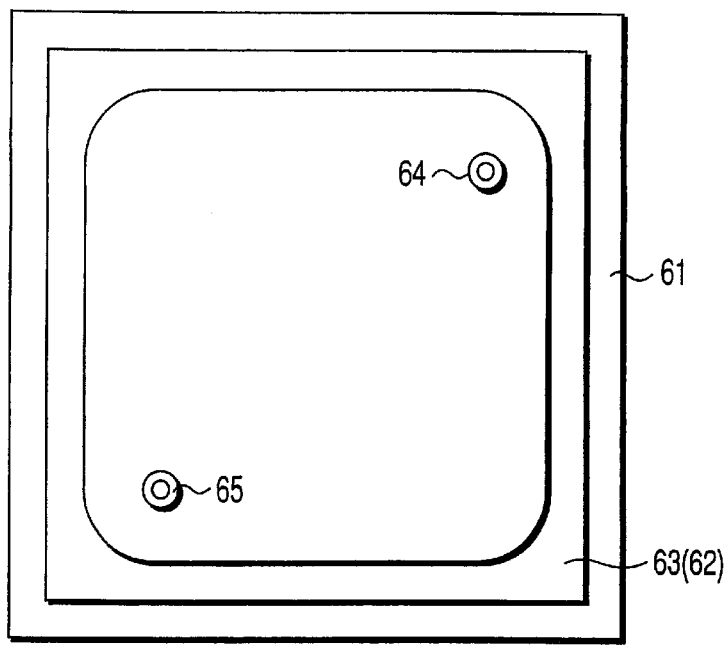
FIGS. 2A and 2B are a plan view and a sectional side view, respectively, showing an ozone generator employed in the apparatus shown in FIG. 1.
Figure 2B:
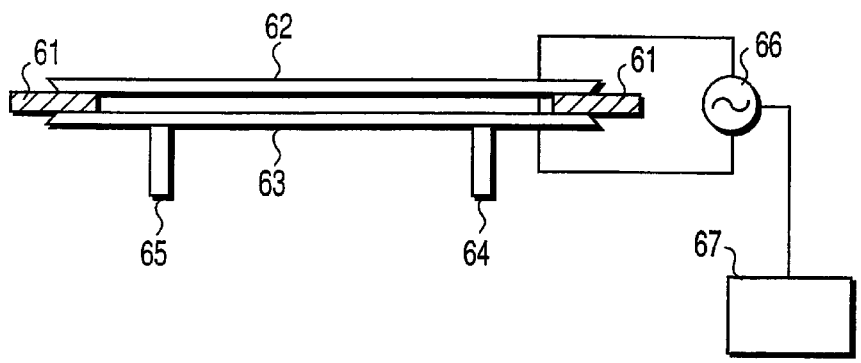

FIGS. 2A and 2B are a plan view and a sectional side view, respectively, showing an ozone generator 33. The ozone generator 33 includes a gasket 61 made of a fluorocarbon-based gum, and a pair of electrodes 62 and 63 sandwiching the gasket 61. The surfaces of the electrodes 62 and 63, which are brought into contact with the raw material gas, are coated with a ceramic. The electrode 63 is provided with an inlet port 64 for the raw material gas, and an outlet port 65 for process gases. The inlet port 64 is connected to a piping line 71 described later, and the outlet port 65 is connected to the piping line 35.

An RF power is selectively applied across the electrodes 62 and 63 from an RF power supply 66, whose voltage is controlled by a voltage controller 67. On the other hand, the output of the ozone densitometer 38, i.e., a measured value of the ozone concentration, is inputted into the voltage controller 67, so that the level of the RF power to be applied to the electrodes 62 and 63 is controlled on the basis of the difference between the measured value and a set value of the ozone concentration. As a result, the ozone concentration is controlled to be the set value, because the ozone concentration varies based on the power level.

The piping line 71 for supplying the raw material gas, which is formed of a mixture of oxygen gas ($O_2$) and nitrogen gas ($N_2$), is connected to the upstream side of the ozone generator 33, i.e., to the inlet port 64 for the raw material gas. The piping line 71 is provided with a valve V1 and a moisture remover 72 in this order from the upstream side. The moisture remover 72 may consist of WAFER PURE MAGE LINE (trade name) made by JAPAN MILLIPORE Co. Ltd., which is formed by combining a stainless steel filter with a chemical adsorbent to remove moisture down to, e.g., 1 ppb or less. The piping line 71 is connected to an oxygen gas source TS1 and a nitrogen gas source TS2, on the upstream side of the valve V1. The composition of the raw material gas to be supplied to the ozone generator 33 is set to be, e.g., 99.5% oxygen and 0.5% nitrogen.

A piping line 73 is connected to the piping line 71 between the ozone generating unit 30 and the moisture remover 72, so as to supply a heated dry gas into a connection piping section 40 through the ozone generating unit 30. The piping line 73 is connected through a valve V2 to a supply source TS3 (including heating means) of the dry gas, which consists of an inactive gas, such as nitrogen or argon. Since the piping line 35 and an inner pipe 41 of the connection piping section 40 described later are made of a fluorocarbon resin, such as PTFE or PFA, the dry gas is set at a temperature of from 80 to 180° C., and preferably of about 150° C.

In the connection piping section 40, the portion between the ozone generating unit 30 and the processing unit 50 is formed of a double-pipe consisting of an inner pipe 41 and an outer pipe 42. The inner pipe 41 is made of a non-metallic material having a certain corrosion-resistance against $NO_x$, such as a fluorocarbon resin, e.g., PTFE or PFA, while the outer pipe 42 is made of, e.g., stainless steel. The outer pipe 42 airtightly surrounds the inner pipe 41 to form a gap space 43 between the inner and outer pipes 41 and 42. The gap space 43 communicates with the interior of the casing 31 through a hole formed in the sidewall of the casing 31.

The inner pipe 41 is connected through a valve V3 to an inlet port for the process gas, formed in the process chamber 51 of the processing unit 50, as described later. A bypass line 44 branches from the inner pipe 41 before the valve V3, and is connected to an exhaust line 80 of the processing unit 50 through a valve V4. In other words, the bypass line 44 is arranged parallel to the process chamber 51.

Piping lines 45a and 45b are connected to the connection piping section 40 near the valves V3 and V4, for supplying a ventilation gas into the gap space 43. The piping lines 45a and 45b are connected through valves V5 and V6 to a supply source TS4 of the ventilation gas, which consists of an inactive gas, such as nitrogen or argon. Accordingly, even when ozone gas leaks from the inner pipe 41, the outer pipe 42 prevents the ozone gas from leaking into a working area. Particularly, the ventilation gas, which flows from the supply lines 45a and 45b to the exhaust line 32, usually ventilates the interior of the gap space 43 to ensure a high safety.

Figure 3:
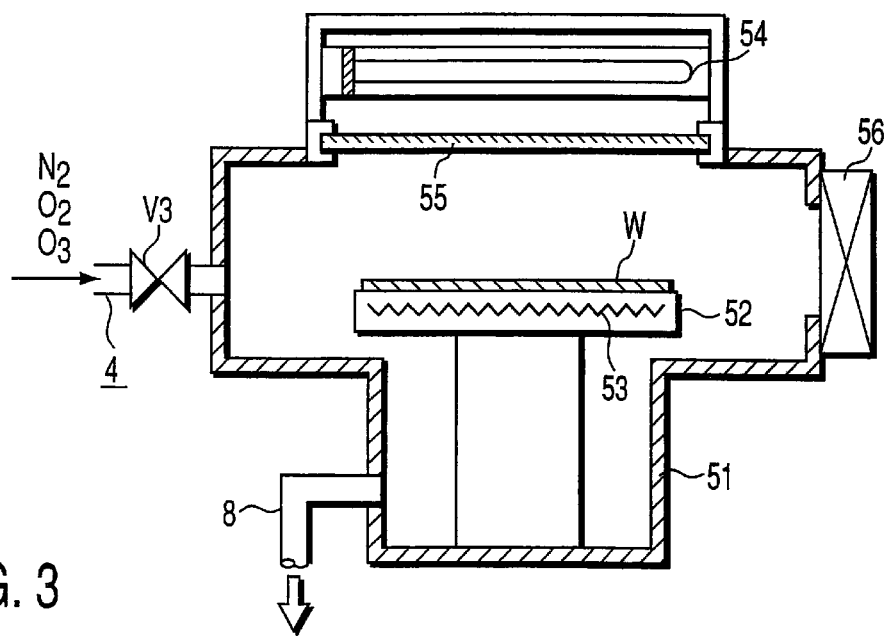
FIG. 3 is a sectional side view showing a reforming process unit employed in the apparatus shown in FIG. 1.

FIG. 3 is a sectional side view showing the reforming processing unit 50. The processing unit 50 includes the airtight process chamber 51, in which a worktable 52 is disposed at the center of the bottom. The worktable 52 has a circular top surface (mounting surface), on which a semiconductor wafer W is mounted. In the worktable 52, heating means for heating the wafer W, such as a heater 53 formed of, e.g., a heating resistor, is embedded near the mounting surface, and connected to a power supply (not shown).

A transmitting window 55 made of quartz is formed at the ceiling of the process chamber 51 and faces the mounting surface. A UV (Ultra Violet) lamp 54 is disposed above the transmitting window 55, so that it radiates ultraviolet rays into the process chamber 51 through the transmitting window 55 to activate the process gas (ozone). A gate valve 56 is arranged on a sidewall of the process chamber 51, for transferring the wafer W into and out of the process chamber 51. An exhaust line 80 is connected to the process chamber 51 near the bottom, and the vacuum pump 81 is connected to the exhaust line 80 through a valve V7. The valve V7 is disposed on the upstream side or closer to the process chamber 51, relative to a portion at which the bypass line 44 is connected to the exhaust line 80.

An explanation will be given of operations of the ozone processing apparatus, respectively for a processing step of performing an ozone process on a target substrate, and for a drying step of the apparatus performed after a maintenance operation of the apparatus.

In the processing step, at first, a raw material gas consisting of, e.g., 99.5% oxygen and 0.5% nitrogen, is supplied through the valve V1, the piping line 71, and the moisture remover 72 to the ozone generator 33. The oxygen used as the main part of the material gas is replenished into the oxygen gas source TS1 by, e.g., a tank lorry, and thus generally has a purity of from about 99.5 to 99.9%, and contains moisture to some extent. Accordingly, the raw material gas is caused to flow through the moisture remover 72, so that the moisture mixed in the oxygen gas is removed. Since the moisture remover 72 is disposed on the upstream side of the ozone generator 33, nitric acid is less produced due to reaction of moisture contained in the raw material gas with $NO_x$ produced when ozone is generated in the ozone generator 33. As a result, it is possible to prevent a metallic material, such as aluminum or stainless steel, which is used for the inner wall surface of the process chamber 51, from being corroded.

The oxygen gas contained in the raw material gas is turned into ozone gas at, e.g., about 8 vol. %, by the voltage applied thereto in the ozone generator 33. The process gas containing ozone thus generated is sent to the pressure regulator 34 through the piping line 35. The interior of the ozone generator 33 is set to be a pressure-increased atmosphere of about 0.1 MPa (G), while the process pressure in the process chamber 51 is set to be a pressure-reduced atmosphere of about 5 kPa (A). For this reason, the pressure of the process gas is adjusted by the pressure regulator 34.

The process gas flows out from the ozone generator 33 at a flow rate of, e.g., 10 lit./min., and part of the gas flows to the branch line 36 at a flow rate of, e.g., about 500 cc/min., and is then exhausted to the outside through the flowmeter 37 and the densitometer 38. The concentration of ozone in the process gas flowing in the branch line 36 is measured by the densitometer 38, so that the voltage in the ozone generator 33 is controlled on the basis of the measured value, as described previously.

Until the ozone generating amount becomes stable after the start of supplying the raw material gas, the process gas is exhausted through the bypass line 44 to the exhaust line 80, while the valve V3 is closed and the valve V4 is opened. Then, the valves V3 and V4 are switched to supply the process gas into the process chamber 51. The wafer W to be processed has been mounted on the worktable 52 at this time.

Ozone in the process gas is activated by the energy of ultraviolet rays from the UV lamp 54 to produce oxygen radicals. The oxygen radicals thus produced are used to perform a reforming process (annealing process) on the tantrum oxide film ($TaO_x$) disposed on the wafer W. More specifically, the oxygen radicals enter gap portions in the tantrum oxide film ($TaO_x$) and are turned into oxygen ions. The oxygen ions form a chemically stable structure in cooperation with tantrum atoms in the film, so as to improve the quality of the film.

Incidentally, a metallic material, such as stainless steel, is generally used for the zone densitometer 38. In conventional structures, this is a cause to bring about the problem of metal contamination in the wafer W. In this respect, according to the apparatus shown in FIG. 1, the flowmeter 37, which is made of, e.g., PTFE, and the densitometer 38 are disposed on the branch line 36 extending from the piping line 35, so that the process gas, which has been measured, does not flow into the process chamber 51. As a result, even if nitric acid is produced, it is possible to prevent a metal corrosion caused by the nitric acid from affecting the wafer W. Furthermore, the flowmeter 37 forms a pressure difference to function as means for preventing a backward flow of the gas, so that the metal contamination is more reliably prevented.

Next, the drying step of the apparatus will be explained. For example, when the ozone generation unit 30 and the connection piping section 40 are separated from each other and the interior of the inner pipe 41 is exposed to the atmosphere for a maintenance operation, moisture sticks to the inner surface of the inner pipe 41. The drying step is performed by supplying a heated dry gas into the inner pipe 41, so that the inner pipe 41 is dried out from the inner surface to remove the sticking moisture.

More specifically, first, a dry gas, such as nitrogen gas, heated to a temperature in a range of from 80 to 180° C., preferably at about 150° C., is supplied from the piping line 73 to the ozone generation unit 30, where the valves V1 and V3 are closed while the valves V2 and V4 are opened. The dry gas is exhausted from the ozone generation unit 30 through the inner pipe 41 and the bypass line 44 to the exhaust line 80. The dry gas is kept being supplied for, e.g., about one hour.

Where the connection piping section 40 is heated, the moisture, which stuck to the inside of the connection piping section 40 during a maintenance operation, is swiftly evaporated. For example, a porous material, such as PTFE, is used for the inner pipe 41, the moisture enters the pores. For this reason, it is effective to cause the dry gas to flow in the inner pipe 41, so that the inner pipe 41 is directly heated. By doing so, the connection piping section 40 can be dried out without taking much time, thereby improving the operation rate of the apparatus. The heated dry gas may be supplied into the inner pipe 41 from a position immediately downstream from the ozone generation unit 30.

The ozone processing apparatus shown in FIG. 1 includes the moisture remover 72 disposed on the upstream side of the ozone generator 33, thereby reducing the moisture in the process gas to a very small amount or substantially zero. As a result, even if $NO_x$ is contained therein, production of nitric acid is suppressed, so that the inner wall of the process chamber 51 is prevented from being corroded, thereby reducing contamination in the wafer W. As described above, oxygen from the oxygen gas source TS1 cannot avoid containing moisture to some extent, but a small amount of moisture can cause metal corrosion in the ozone processing apparatus. Accordingly, it is effective to dispose the moisture remover 72 on the upstream side of the ozone generator 33.

Furthermore, a device employing metals, which may be corroded, such as the densitometer 38, is disposed on the branch line 36 of the process gas, so that the wafer W is prevented from being contaminated by metal corrosion. After a maintenance operation, a heated dry gas is caused to flow in the connection piping section 40, so that the moisture in the pores of the porous inner pipe 41 is swiftly evaporated. The dry gas is exhausted through the bypass line 44, so that the inflow of moisture into the processing unit 50 does not occur. After the piping lines are dried out, a dry gas is caused to flow into the process chamber 51 through the valve V3, so that the whole structure including the process chamber 51 is dried out.

The connection piping section 40 may be formed of a single-pipe structure of, e.g., stainless steel. Also, in this case, arranging the moisture remover 72 is effective in suppressing corrosion of piping lines. The moisture remover 72 may be disposed on the supply passage 72a of oxygen gas. As a part of the raw material gas, Co gas may be used in place of nitrogen gas, and, also in this case, it is necessary to remove moisture, because $CO_2$ may be produced.

Figure 4:
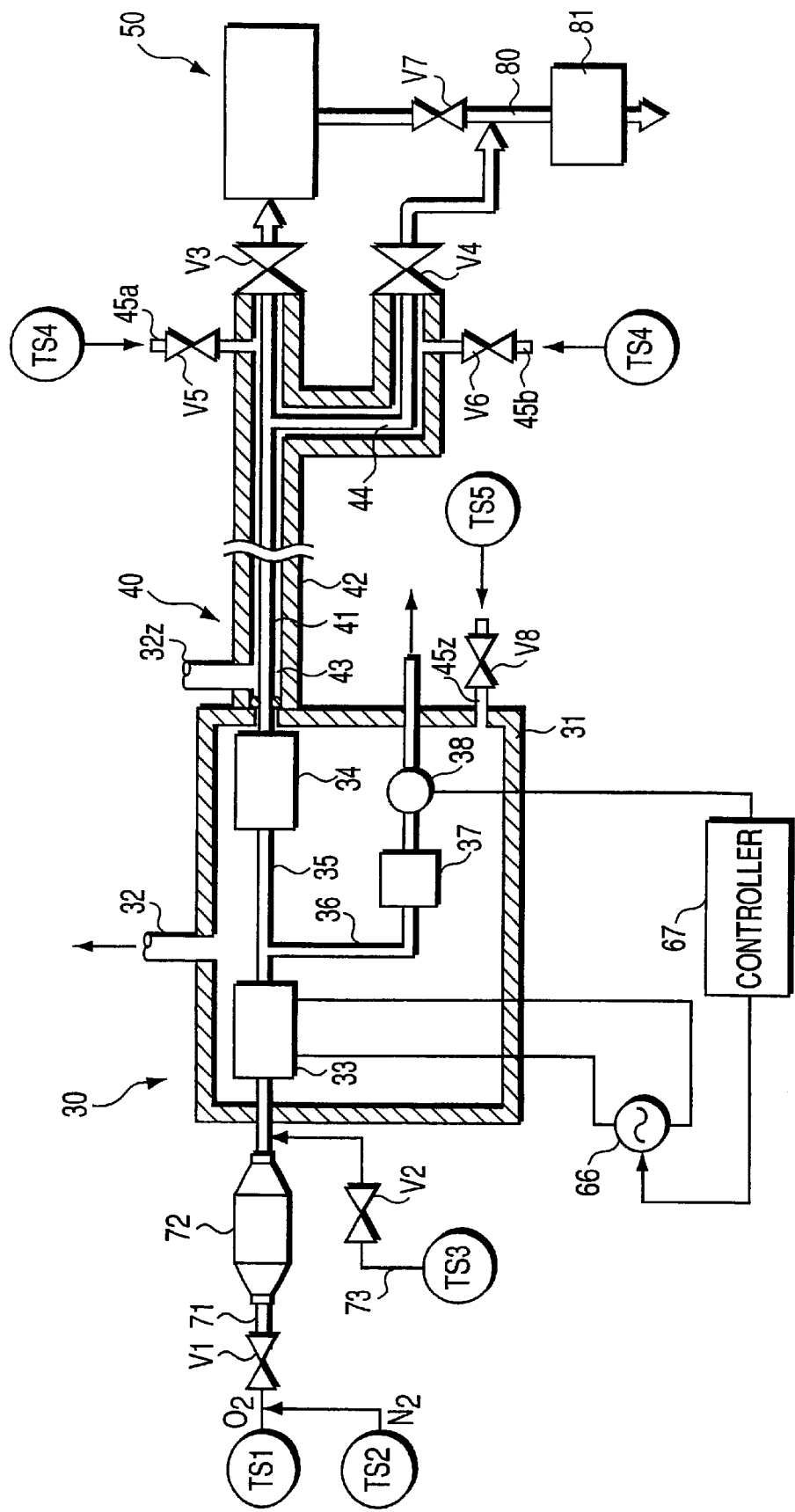
FIG. 4 is a sectional view showing an ozone processing apparatus according to another embodiment of the present invention.

FIG. 4 is a sectional view showing an ozone processing apparatus according to another embodiment of the present invention. In this apparatus, a space in the casing 30 of an ozone generating unit 30 and a gap space 43 in a connection piping section 40 do not communicate with each other, but they are ventilated independently of each other. For this purpose, the casing 31 is provided with a supply line 45z, which is connected through a valve V8 to a supply source TS5 of a ventilation gas consisting of an inactive gas, such as nitrogen or argon. On the other hand, the most upstream side of the gap space 43 is connected to an exhaust line 32 communicating with a factory exhaust passageway (not shown).

The apparatus shown in FIG. 4 further includes a supply source TS4 with heating means, for supplying a ventilation gas consisting of an inactive gas, such as nitrogen or argon, into the gas space 43. Accordingly, the ventilation gas to be supplied through the supply line 45z to the gap space 43 can be a heated dry gas. Since the material of an inner pipe 41 and so forth is a fluorocarbon resin, such as PTFE or PFA, the dry gas is set at a temperature of from 80 to 180° C., and preferably of about 150° C.

With this arrangement, a heated dry gas is used, if necessary, as the ventilation gas to be supplied to the gap space 43. In this case, the inner pipe 41 is dried out from the outer surface to complete the drying operation in a shorter time, thereby improving the operation rate of the apparatus. The dry gas does not flow into the casing 31 of the ozone generating unit 30, and thus does not affect the ozone generator 33.

In the apparatuses shown in FIGS. 1 and 4, the outer pipe 42 or the inner pipe 41 may be provided with heating means, e.g., wrapped with a tape heater, around it, for performing indirect heat conduction to dry the inner pipe 41. This kind of heating means may be employed along with a system for using a dry gas or a ventilation gas. In the above described embodiments, the reforming processing apparatus is described as an example of an ozone processing apparatus, but the present invention may be applied to another apparatus for performing a process using ozone, such as an oxidizing apparatus, a diffusion apparatus, or a film-forming apparatus. Furthermore, in the above described embodiments, a semiconductor wafer is described as an example of a target substrate, but the present invention may be applied to an LCD substrate, a glass substrate, or the like.

According to the present invention, where a target substrate is processed with ozone gas, it is possible to prevent the inside of gas passageways and a process chamber from being corroded by components of a process gas, thereby reducing contamination in the target substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An ozone processing apparatus for a semiconductor processing system, comprising:

an airtight process chamber;

a support member disposed in the process chamber and configured to support a target substrate;

an exhaust system configured to exhaust the process chamber;

a process gas supply line connected to the process chamber;

an ozone generator connected to the process gas supply line and configured to supply an ozone-containing gas through the process gas supply line into the process chamber;

a raw material gas supply line connected to the ozone generator;

an oxygen source connected to the raw material gas supply line and configured to supply oxygen gas through the raw material gas supply line into the ozone generator; and a drying system configured to supply a heated dry gas into the process gas supply line, thereby drying the process gas supply line from an inner surface.

2. The apparatus according to claim 1, wherein the process gas supply line is made of a non-metallic material.

3. The apparatus according to claim 2, further comprising:

a branch line extending from the process gas supply line and arranged not to be connected to the process chamber;

a densitometer disposed on the branch line and configured to measure ozone concentration of the ozone-containing gas; and a controller configured to control the ozone generator with reference to a measured value of the ozone concentration measured by the densitometer.

4. The apparatus according to claim 3, further comprising a backward-flow-preventing member disposed on the branch line between the process gas supply line and the densitometer.

5. The apparatus according to claim 4, wherein the backward-flow-preventing member comprises a flowmeter configured to generate a pressure difference in the branch line.

6. The apparatus according to claim 2, further comprising an envelope airtightly surrounding the process gas supply line such that a gap space is formed between the process gas supply line and the envelope, and a ventilation system configured to ventilate the gas space.

7. The apparatus according to claim 6, wherein the ventilation system comprises a system configured to supply a heated dry gas into the gap space, thereby drying the process gas supply line from an outer surface.

8. The apparatus according to claim 7, wherein the process gas supply line is made of a fluorocarbon resin, and the dry gas of the ventilation system is heated at a temperature of from 80 to 180° C.

9. The apparatus according to claim 6, wherein the dry gas of the ventilation system is selected from the group consisting of nitrogen and argon.

10. The apparatus according to claim 1, further comprising a bypass line connecting a near end portion of the process gas supply line to the exhaust system in parallel to the process chamber, and configured to be selectively opened/closed.

11. The apparatus according to claim 1, further comprising a moisture remover disposed on the raw material gas supply line.

12. The apparatus according to claim 1, wherein the dry gas is selected from the group consisting of nitrogen and argon.

13. The apparatus according to claim 12, wherein the process gas supply line is made of a fluorocarbon resin, and the dry gas is heated at a temperature of from 80 to 180° C.

* * * * *